(12) United States Patent
Cheng et al.

(10) Patent No.: US 9,390,223 B2
(45) Date of Patent: Jul. 12, 2016

(54) METHOD OF DETERMINING WHETHER A LAYOUT IS COLORABLE

(71) Applicant: TAIWAN SEMICONDUCTOR MANUFACTURING COMPANY, LTD., Hsinchu (TW)

(72) Inventors: Wen-Li Cheng, Taipei (TW); Ming-Hui Chih, Luzho (TW); Chia-Ping Chiang, Taipei (TW); Ken-Hsien Hsieh, Taipei (TW); Tsong-Hua Ou, Taipei (TW); Wen-Chun Huang, Tainan (TW); Ru-Gun Liu, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/872,338

(22) Filed: Oct. 1, 2015

(65) Prior Publication Data
US 2016/0019333 A1 Jan. 21, 2016

Related U.S. Application Data

(63) Continuation of application No. 13/955,780, filed on Jul. 31, 2013, now Pat. No. 9,176,373.

(51) Int. Cl.
*G06F 17/50* (2006.01)
*G03F 1/00* (2012.01)

(52) U.S. Cl.
CPC .............. *G06F 17/5081* (2013.01); *G03F 1/00* (2013.01)

(58) Field of Classification Search
USPC .................................... 716/50, 51, 52, 53, 54
See application file for complete search history.

(56) References Cited

U.S. PATENT DOCUMENTS

| 8,484,607 B1* | 7/2013 | Tang ................... | G06F 17/5081 716/136 |
| 8,627,245 B1* | 1/2014 | Banerjee .............. | G03F 7/70466 716/50 |
| 8,647,893 B1* | 2/2014 | Agarwal .............. | G06F 17/5081 257/E21.522 |
| 2014/0007026 A1* | 1/2014 | Chen ................... | G06F 17/5072 716/55 |

OTHER PUBLICATIONS

Bei Yu, Kun Yuan, Boyang Zhang, Duo Ding, David Z. Pan, "Layout Decomposition for Triple Patterning Lithography", ECE Dept. University of Texas at Austin, TX USA 78712, 2011 IEEE.*

* cited by examiner

*Primary Examiner* — Brian Ngo
(74) *Attorney, Agent, or Firm* — Hauptman Ham, LLP

(57) ABSTRACT

A method of determining whether a layout is colorable includes assigning nodes to polygon features of the layout. The method includes designating nodes as being adjacent nodes for nodes separated by less than a minimum pitch. The method includes iteratively removing nodes having less than three adjacent nodes from consideration to identify a node arrangement, wherein all nodes in the node arrangement have at least three adjacent nodes. The method includes determining whether the layout is colorable based on the node arrangement. Determining whether the layout is colorable includes independently assessing each internal node of node arrangement to determine whether each internal node of the node arrangement is colorable. The method includes generating a colored layout design for fabrication of the semiconductor device if each internal node of the node arrangement is colorable; and modifying the layout if at least one internal node of the node arrangement is not colorable.

20 Claims, 12 Drawing Sheets

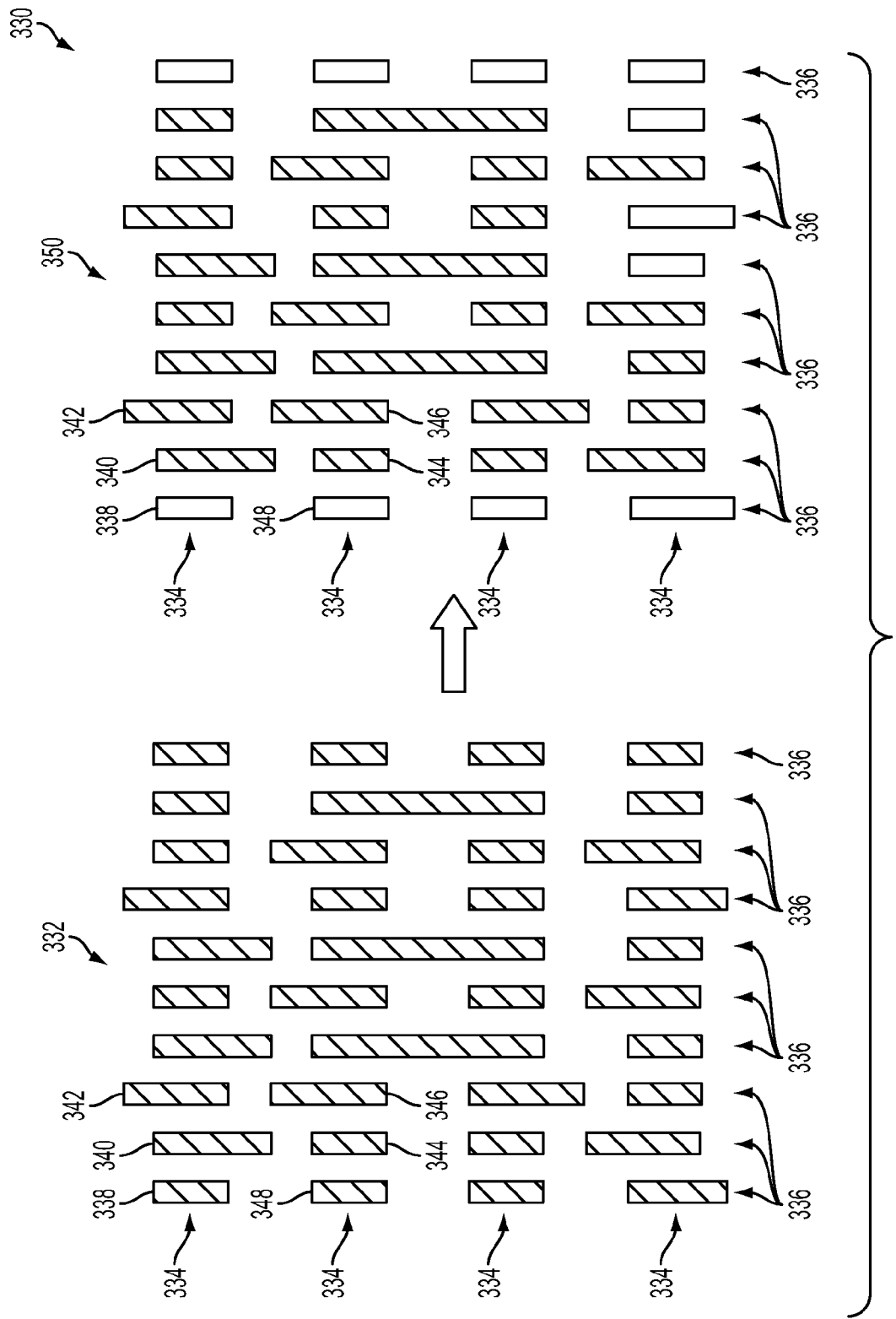

METHOD OF DETERMINING WHETHER A LAYOUT IS COLORABLE

PRIORITY CLAIM

The present application is a continuation of U.S. application Ser. No. 13/955,780, filed Jul. 31, 2013, which is incorporated herein by reference in its entirety.

BACKGROUND

Integrated circuit (IC) process limitations associated with decreasing minimum feature size tend to favor multiple photoresist mask patterns to achieve a specified minimum feature size with available optical photoresist mask patterning equipment. For example, double patterning, using two mask layers, and triple patterning, using three mask layers, have been used to fabricate semiconductor devices. However, decomposition of a single photoresist mask pattern into three separate mask patterns is currently a labor-intensive, trial and error process. Furthermore, whether or not a photoresist mask pattern will ultimately be capable of being decomposed into three photoresist mask patterns with present methodologies is often not known before significant decomposition efforts have already been employed, resulting in wasted effort.

BRIEF DESCRIPTION OF THE DRAWINGS

Reference is now made to the following descriptions taken in conjunction with the accompanying drawings, in which:

FIG. 3 is a diagram of a first removal iteration of reducing a photoresist mask pattern according to an embodiment;

DETAILED DESCRIPTION

Figure 1A:
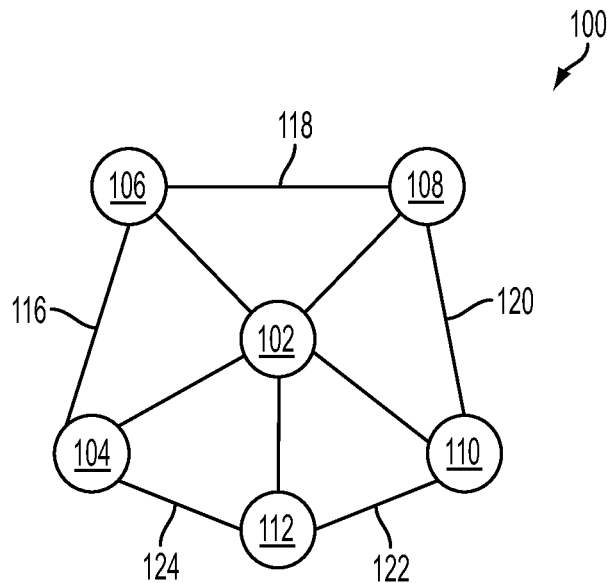
FIG. 1A is a node diagram having an odd-numbered linked triangle number (LTN) according to an embodiment.

The making and using of various embodiments are discussed in detail below. It should be appreciated; however, that the present disclosure provides many applicable inventive concepts that can be embodied in a wide variety of specific contexts. The specific embodiments discussed are examples of specific ways to make and use, and do not limit the scope of the disclosure.

In addition, the present disclosure may repeat reference numerals and/or letters in the various examples or designate corresponding components with same last two digits, but with a different preceding digit or digits. This repetition is for the purpose of simplicity and clarity of identification of corresponding objects and does not necessarily in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," and similar terms as well as derivatives thereof (e.g., "horizontally," "downwardly," "upwardly," and similar.) are used for ease of the present disclosure of one feature in relation to another feature. The spatially relative terms are intended to cover different orientations of the device including the features.

FIG. 1A is a node diagram 100 having an odd-numbered linked triangle number (LTN) according to an embodiment. An internal node 102 is directly connected to each of five adjacent nodes 104, 106, 108, 110 and 112. All six nodes 102-112 represent points or features associated with a circuit layout for decomposition into three different photoresist mask patterns. A triangle 116 is formed by nodes 102, 104, 106. A triangle 118 is formed by nodes 102, 106, 108. Triangle 120 is formed by nodes 102, 108, 110. A triangle 122 is formed by nodes 102, 110, 112. A triangle 124 is formed by nodes 102, 112, 104. A total number of the adjoining (linked) triangles 116, 118, 120, 122, 124 is an odd number, specifically, five. An odd number of linked triangles is designated by LTN equal to 1, while an even number of linked triangles is designated by an LTN equal to 0. LTN is determined with regard to one or more internal nodes, such as internal node 102. Mapping and identification of an odd number of linked triangles (LTN=1) indicates that the design is not readily mappable to three different layers, while mapping and identification of an even number of linked triangles (LTN=0) indicates the design is mappable to three different layers.

Figure 1B:
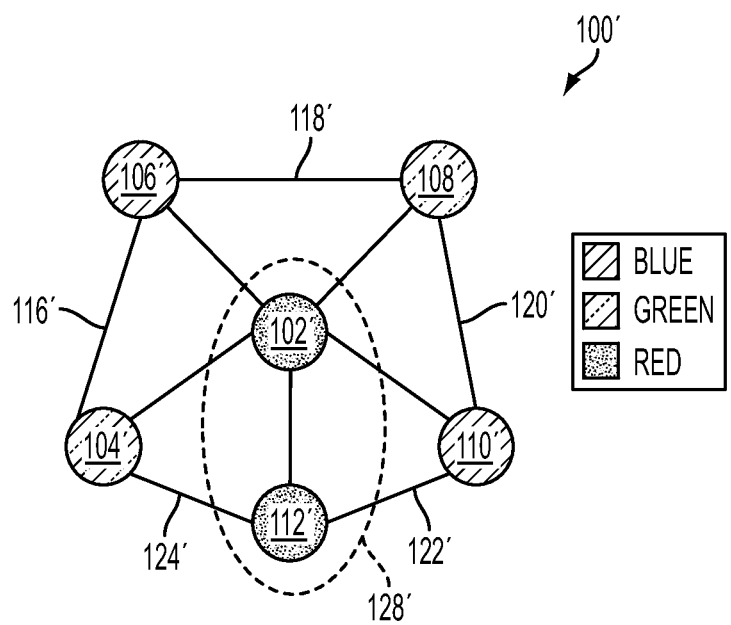
FIG. 1B is a colorized node diagram of the odd-numbered linked triangle number (LTN) of FIG. 1A according to an embodiment.

FIG. 1B is a colorized node diagram 100' of the odd-numbered linked triangle number (LTN) of FIG. 1A according to an embodiment. Indirectly corresponding to each of the three mask layers, the nodes are designated by three separate colors, in this case, red, blue and green. The colors are assigned for separate mathematic designation purposes to determine decomposability of a single photoresist mask pattern into three photoresist mask patterns and do not describe direct mapping or actual coloration of the three mask layers. Adjacent nodes of the same color are not permitted. To begin color mapping, internal node 102' is mapped red, adjacent node 104' is mapped green and adjacent node 106' is mapped blue because node 106' is adjacent to red node 102' and green node 104' in triangle 116'. Mapping proceeds in a clockwise fashion with node 108' being mapped green, because node 108' is adjacent to red node 102' and blue node 106' in triangle 118'. In some embodiments, mapping proceeds in a counter-clockwise fashion, instead. Node 110' is mapped blue, because node 110' is adjacent to red node 102' and green node 108' in triangle 120'. Node 112' is shown as being mapped red, because node 112' is adjacent to green node 104' in triangle 124' and blue node 110' in triangle 122'. Together node 112' and node 102' constitution a rule violation 128' because they are both the same color, i.e., red, and adjacent to one another in the same triangle 122' or 124'. This colorized node diagram 100' illustrates that when LTN=1, corresponding to an odd number of triangles, the layout cannot be decomposed to three colors indirectly corresponding to three photoresist mask patterns or layers by the method described. Thus, LTN is an indicator of the three photoresist mask pattern decomposability (colorability) of a photoresist mask pattern, i.e., the susceptibility of a single photoresist mask pattern to be decomposed into three separate photoresist mask patterns as indicated by the three node color designations without having adjacent nodes being of the same color.

Figure 2A:
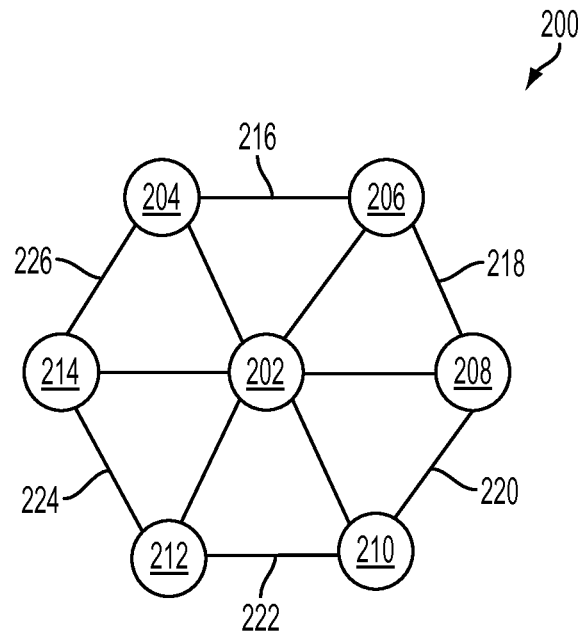
FIG. 2A is a node diagram having an even-numbered linked triangle number (LTN) according to an embodiment.

FIG. 2A is a node diagram 200 having an even-numbered linked triangle number (LTN) according to an embodiment. An internal node 202 is directly connected to each of six adjacent nodes 204, 206, 208, 210, 212 and 214. As described above with regard to FIG. 1A, all seven nodes 202-214 represent points or features associated with a circuit layout for decomposition into three different masks. A triangle 216 is formed by nodes 202, 204, 206. A triangle 218 is formed by nodes 202, 206, 208. A triangle 220 is formed by nodes 202, 208, 210. A triangle 222 is formed by nodes 202, 210, 212. A triangle 224 is formed by nodes 202, 212, 204. A triangle 226 is formed by nodes 202, 214, 204. A total number of the linked triangles 116, 118, 120, 122, 124, 126 is an even number, specifically, six, designated by LTN equal to 0. Mapping and identification of an even number of linked triangles (LTN=0) indicates that the design is mappable to three different photoresist mask layers.

Figure 2B:
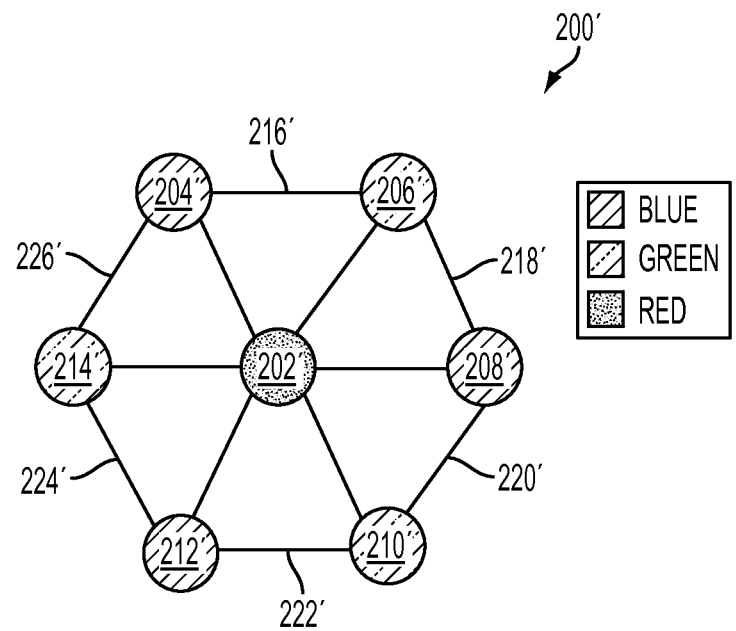
FIG. 2B is a colorized node diagram of the even-numbered linked triangle number (LTN) of FIG. 2A according to an embodiment.

FIG. 2B is a colorized node diagram 200' of the even-numbered linked triangle number (LTN) of FIG. 2A according to an embodiment. Similar to FIG. 1B, each of the three mask layers is designated by a separate color, in this case, red, blue and green. Adjacent nodes of the same color are not permitted. To begin color mapping, internal node 202' is mapped red, adjacent node 204' is mapped blue and adjacent node 206' is mapped green because node 206' is adjacent to red node 202' and blue node 204' in triangle 216'. Mapping proceeds in a clockwise fashion with node 208' being mapped blue, because 208' is adjacent to red node 202' and green node 206' in triangle 218'. In some embodiments, mapping proceeds in a counter-clockwise fashion, instead. Node 210' is green, because node 210' is adjacent to red node 202' and blue node 208' in triangle 220'. Node 212' is blue, because 212' is adjacent to red node 202' and green node 210' in triangle 212'. Node 214' is green, because 214' is adjacent to red node 202' and blue node 212' in triangle 222'. The colorized node diagram 200' is complete with all nodes 202', 204', 206', 208', 210', 212', 214' having a designated color and no rule violations because every node is adjacent only to nodes of a different color.

FIG. 3 is a diagram of a first removal iteration of reducing a photoresist mask pattern 330 according to an embodiment. An original photoresist mask pattern 332 for a single mask is shown with four horizontal rows 334 and ten vertical columns 336. Each rectangular block (polygon) is treated as a separate node, as described herein, corresponding to the nodes described with regard to in FIGS. 1A-2B, above. Original photoresist mask pattern 332 has 37 polygons or nodes in 4 rows 334 and 10 columns 336. Note that three polygons are in two rows 334 each so there are 37 polygons, not 40. Whether any two nodes are considered to be physically close enough to support a line between as shown in FIGS. 1A-2B, i.e., whether a nearby node is physically close enough to be considered to be an adjacent node, depends on the minimum mask pitch distance G0. G0 in turn depends on the processing equipment being used and minimum feature sizes producible with that equipment. For example, in original photoresist mask pattern 332, polygon 338 has one adjacent node, specifically polygon 340. However, polygon 340 has five adjacent nodes, specifically polygons 338, 342, 344, 346, 348 because they are all within the G0 distance of polygon 340. Polygon 348 has two adjacent nodes, specifically polygon 340, 344. Note that all extended polygons in FIGS. 3-11, i.e., those polygons that are vertically longer than the shortest polygons, are considered to be adjacent to a polygon that the extended polygon is extended towards, for example, polygon 340 is extended towards and adjacent to polygon 346, 344, 348, but in contrast, polygon 338 is not extended towards and is not adjacent to polygon 348.

The first removal iteration 330 (i.e., moving from left to right on the diagram) of reducing the photoresist mask pattern 332 temporarily removes polygons having two or less adjacent nodes. For example, polygon 338 and polygon 348 are both temporarily removed because 338 has one adjacent node and 348 has two adjacent nodes. Polygons 340, 342, 344 and 346 are retained in a first iteration product 350. Other polygons having two or less adjacent nodes are also temporarily removed, leaving only 26 of the original 37 polygons remaining after the first iteration 330. Information about which polygons were temporarily removed is stored in a memory device to facilitate later replacement in reverse order from removal.

Figure 4:
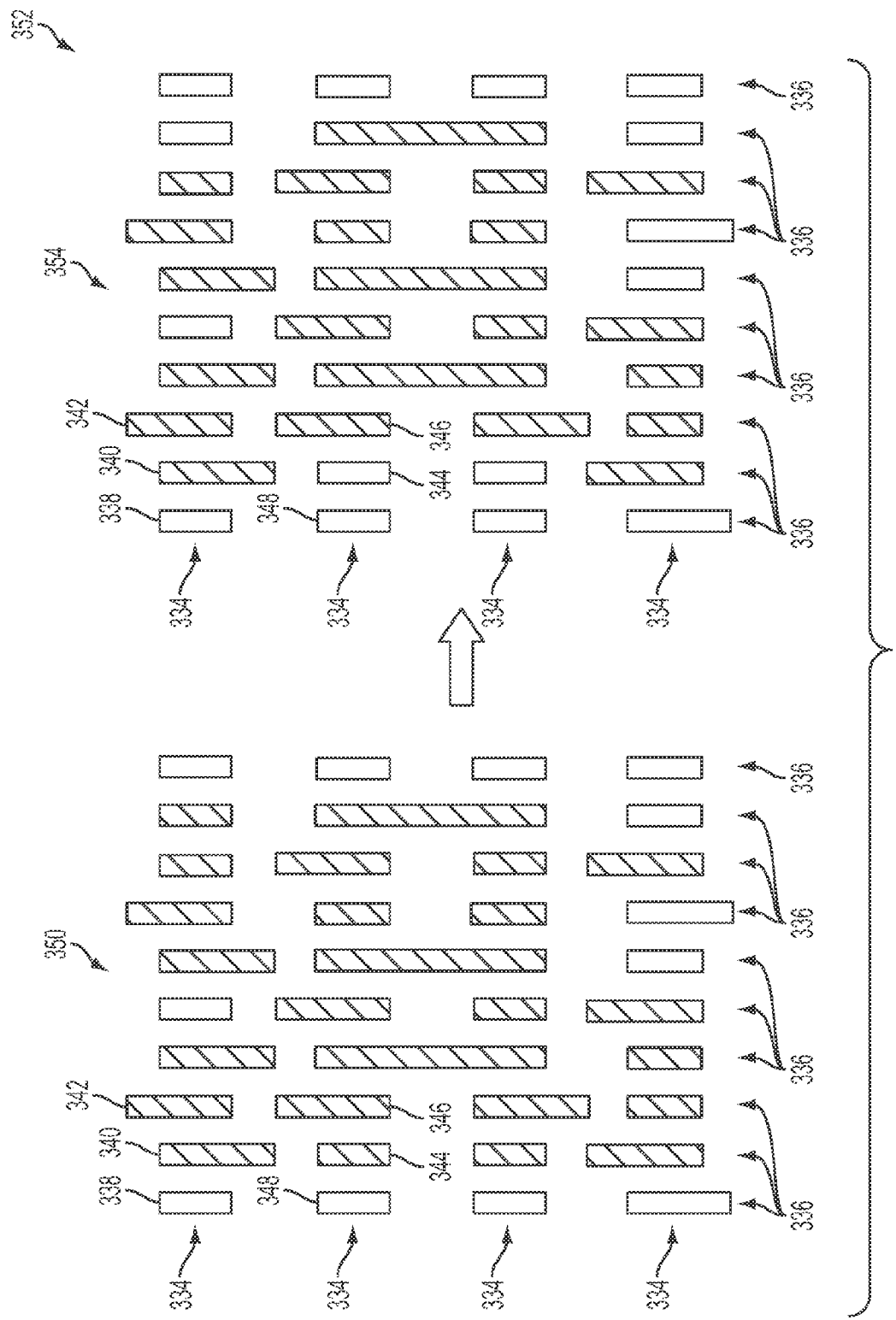
FIG. 4 is a diagram of a second removal iteration of further reducing the photoresist mask pattern according to an embodiment.

FIG. 4 is a diagram of a second removal iteration 352 (i.e., moving from left to right on the diagram) of further reducing the photoresist mask pattern 332 according to an embodiment. Similar to the first removal iteration 330, the second removal iteration 352 temporarily removes polygons having two or less adjacent nodes. For example, polygon 344 is temporarily removed because polygon 344 has only two adjacent nodes, specifically polygon 340 and polygon 346. While polygon 344 had three adjacent nodes 340, 346, 348 in original photoresist mask pattern 332, polygon 348 was removed in the first removal iteration 350, thereby reducing the number of adjacent nodes with regard to polygon 344 from three to two, indicating the removal of polygon 344 in a second removal iteration product 354. Polygons 340, 342 and 346 are retained after the second removal iteration 352 in the second removal iteration product 354. Other polygons having two or less adjacent nodes are also temporarily removed, leaving 23 of the original 37 polygons in the second removal iteration product 354. Again, information about which polygons were temporarily removed is stored to facilitate their later replacement.

Figure 5:
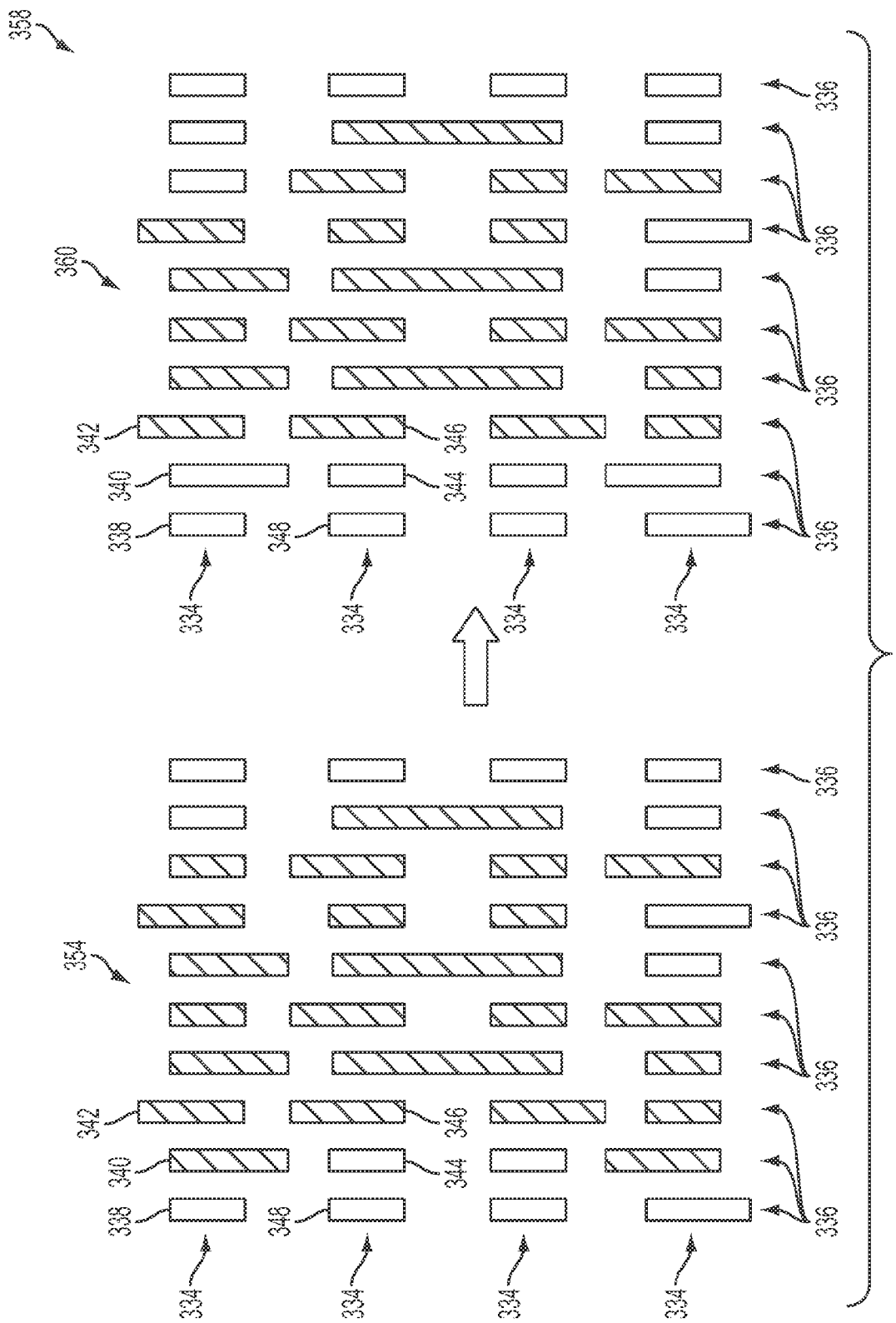
FIG. 5 is a diagram of a third removal iteration of further reducing the photoresist mask pattern according to an embodiment.

FIG. 5 is a diagram of a third removal iteration 358 (i.e., moving from left to right on the diagram) of further reducing the photoresist mask pattern 332 according to an embodiment. Similar to the first removal iteration 330 and second removal iteration 352, the third removal iteration 358 temporarily removes polygons having two or less adjacent nodes. For example, polygon 340 is temporarily removed because polygon 340 has only two adjacent nodes, specifically polygon 342 and polygon 346. While polygon 340 previously had five adjacent nodes 338, 342, 344, 346, 348 in original photoresist mask pattern 332, polygon 338, 348 were removed in the first removal iteration 350 and polygon 344 was removed in the second removal iteration 352, thereby reducing the number of adjacent nodes with regard to polygon 344 from three to two, indicating the removal of polygon 340 in a third iteration product 360. Polygons 342 and 346 are retained after the third removal iteration 354 in the third removal iteration product 360. Other polygons having two or less adjacent nodes are also temporarily removed, leaving 20 of the original 37 polygons in third removal iteration product 360. Again, information about which polygons were temporarily removed is stored to facilitate their later replacement.

Figure 6:
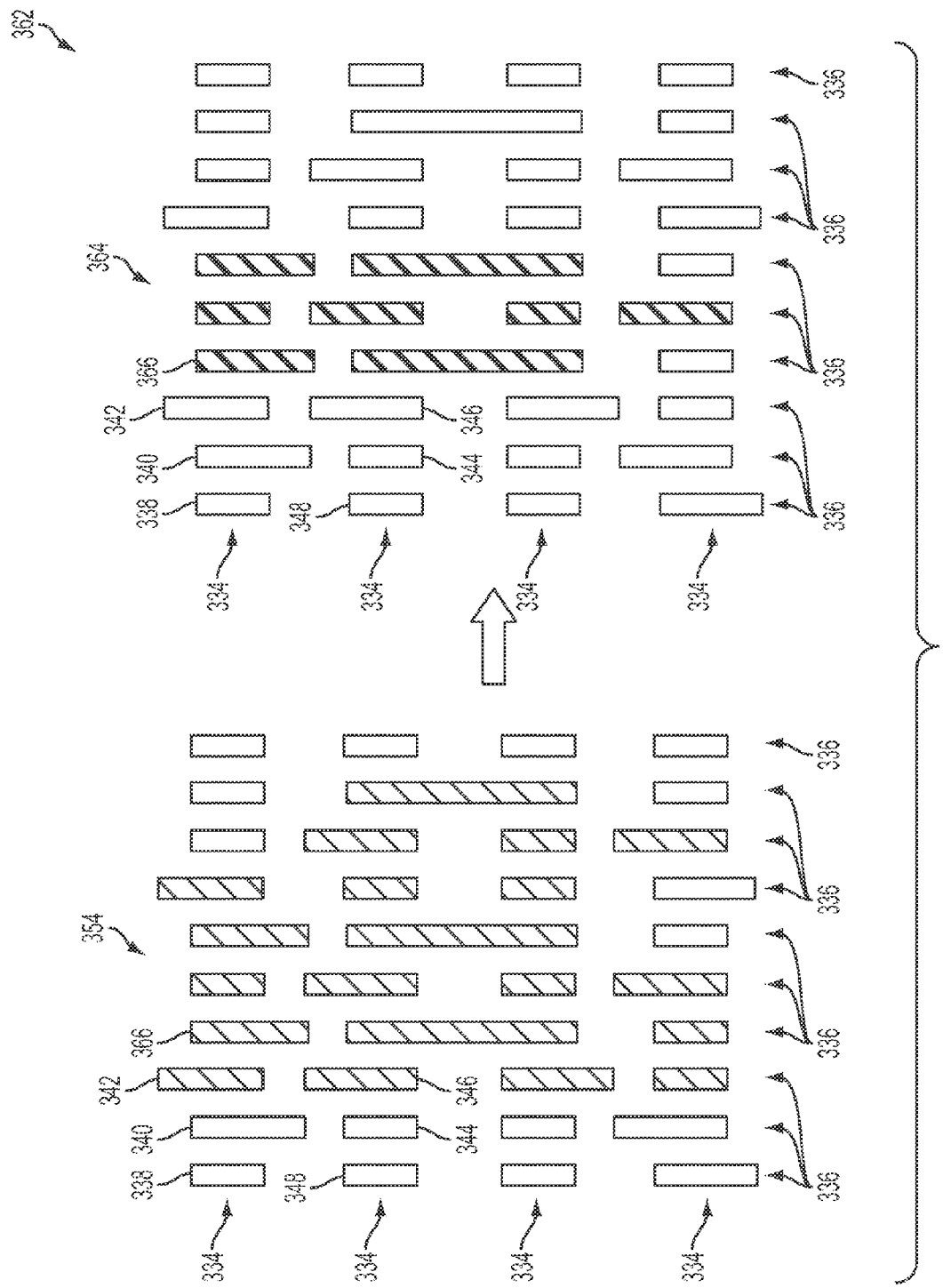
FIG. 6 is a diagram of an Nth removal iteration of further reducing a photoresist mask pattern according to an embodiment.

FIG. 6 is a diagram of an Nth removal iteration 362 (i.e., moving from left to right on the diagram) of further reducing the photoresist mask pattern 332 according to an embodiment. Similar to the first removal iteration 330, the second removal iteration 352, and the third removal iteration 358, the Nth removal iteration 362 represents the last in a series of removal iterations. The Nth removal iteration 362 temporarily removes polygons having two or less adjacent nodes, producing an Nth removal iteration product 364 that contains only those polygons having three or more adjacent nodes. For example, polygon 342 is temporarily removed because polygon 342 had only two adjacent nodes, specifically polygon 346 and polygon 366. While polygon 342 previously had three adjacent nodes 340, 346, 366 in original photoresist mask pattern 332, polygon 340 was removed in the third removal iteration 350, thereby reducing the number of adjacent nodes with regard to polygon 344 from three to two, indicating the removal of polygon 342 in an Nth iteration product 364, or an intermediate removal iteration. Polygons 342 and 346 are removed after the Nth removal iteration 362 in the Nth removal iteration product 364. Other polygons having two or less adjacent nodes are also temporarily removed, leaving 8 of the original 37 polygons in Nth removal iteration product 364. Again, information about which polygons were temporarily removed is stored in a memory device to facilitate their later replacement. Note that in some embodiments, no nodes remain in the Nth removal iteration product 364, LTN is zero and the map is colorable and the node map is colored as described herein.

Figure 7:
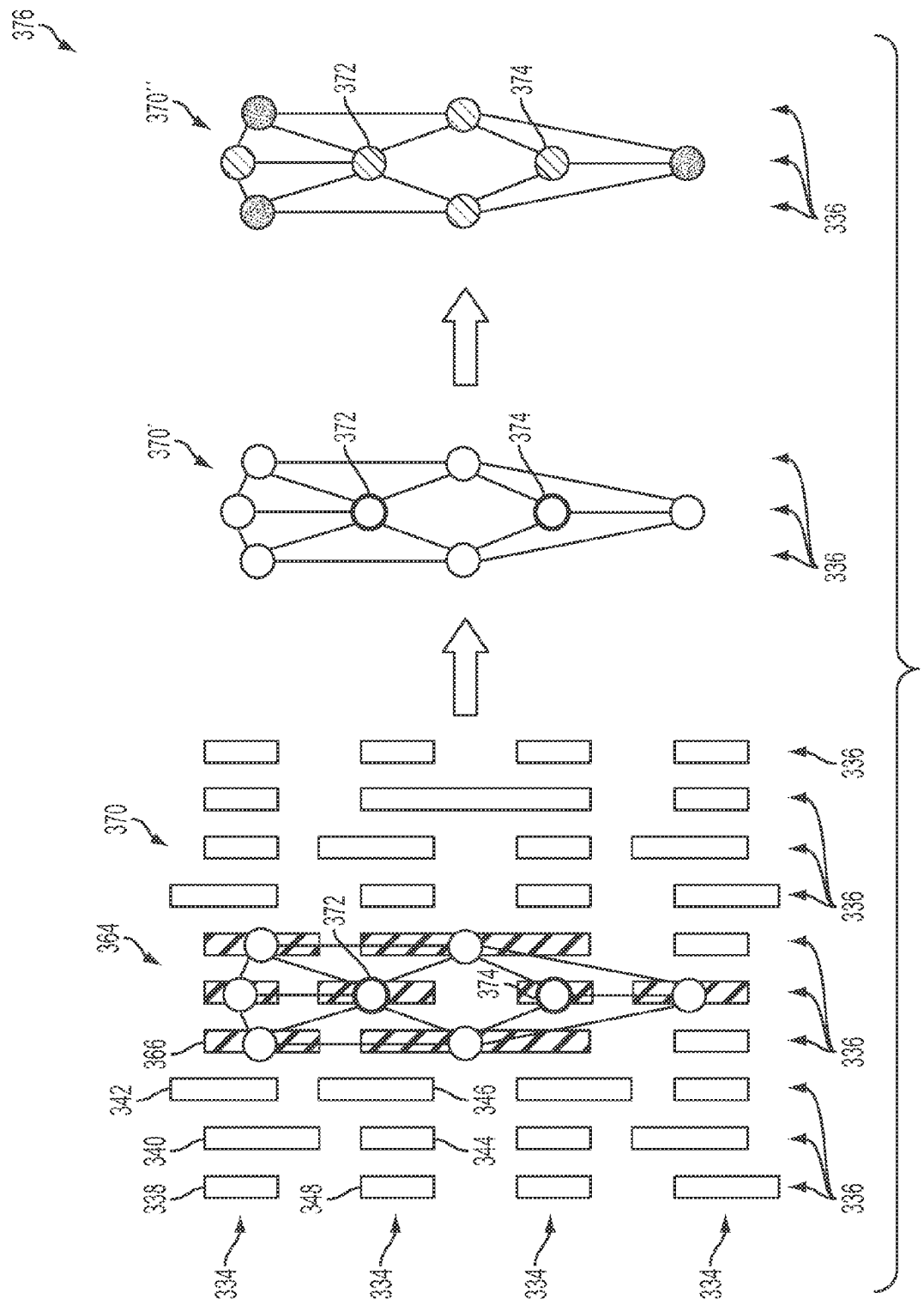
FIG. 7 is a colorization diagram of the Nth removal iteration product of a photoresist mask pattern according to an embodiment.

FIG. 7 is a colorization diagram of the Nth removal iteration product 364 of the photoresist mask pattern 332 according to an embodiment. A colorization process 376 includes a node diagram 370, having even-numbered LTNs for first internal node 372 and second internal node 374, illustrated over the Nth removal iteration product 364. To the right of node diagram 370, node diagram 370' is illustrated separately without the Nth removal iteration product 364 for clarity. To the right of node diagram 370', node diagram 370" is colorized in accordance with the colorization process described above. Internal nodes 372 and 374 are mapped blue and adjacent nodes (illustrated with connection lines between the nodes) are mapped in alternating green and red. Because no two adjacent nodes are the same color, node diagram 370" is both capable of being colored (colorable) and is colorized, thus indicating the decomposability of the single photoresist mask pattern to three photoresist mask patterns.

Figure 8:
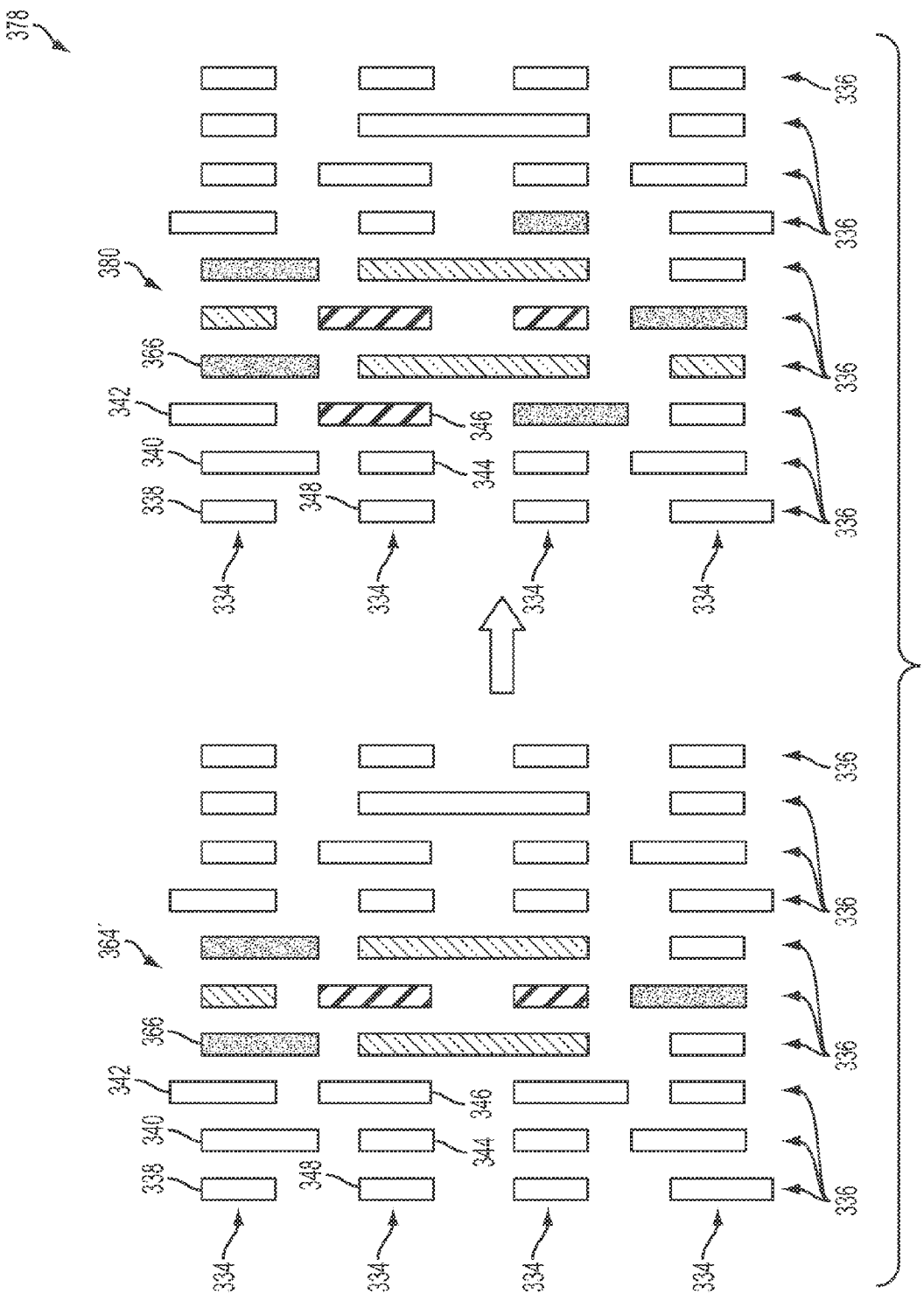
FIG. 8 is a diagram of a first colorization iteration of an accumulating 3-color pattern in a photoresist mask pattern according to an embodiment.

FIG. 8 is a diagram of a first colorization iteration 378 of an accumulating 3-color pattern in a photoresist mask pattern according to an embodiment. Each colorization iteration reverses the order of polygon temporary removal by replacing the polygons in reverse order, i.e., last removed, first replaced and so forth, and maps colors to them as described above. To begin, the Nth removal iteration product 364 is colorized with the colors mapped in node diagram 370" in FIG. 7 to produce colorized Nth removal iteration product 364'. The first colorization iteration 378 then sequentially replaces some of the polygons temporarily removed in the process described above to produce the first colorization iteration product 380. For example, polygon 346 is replaced and mapped blue because polygon 346 is adjacent to red polygon 366 and a green polygon directly below red polygon 366.

Figure 9:
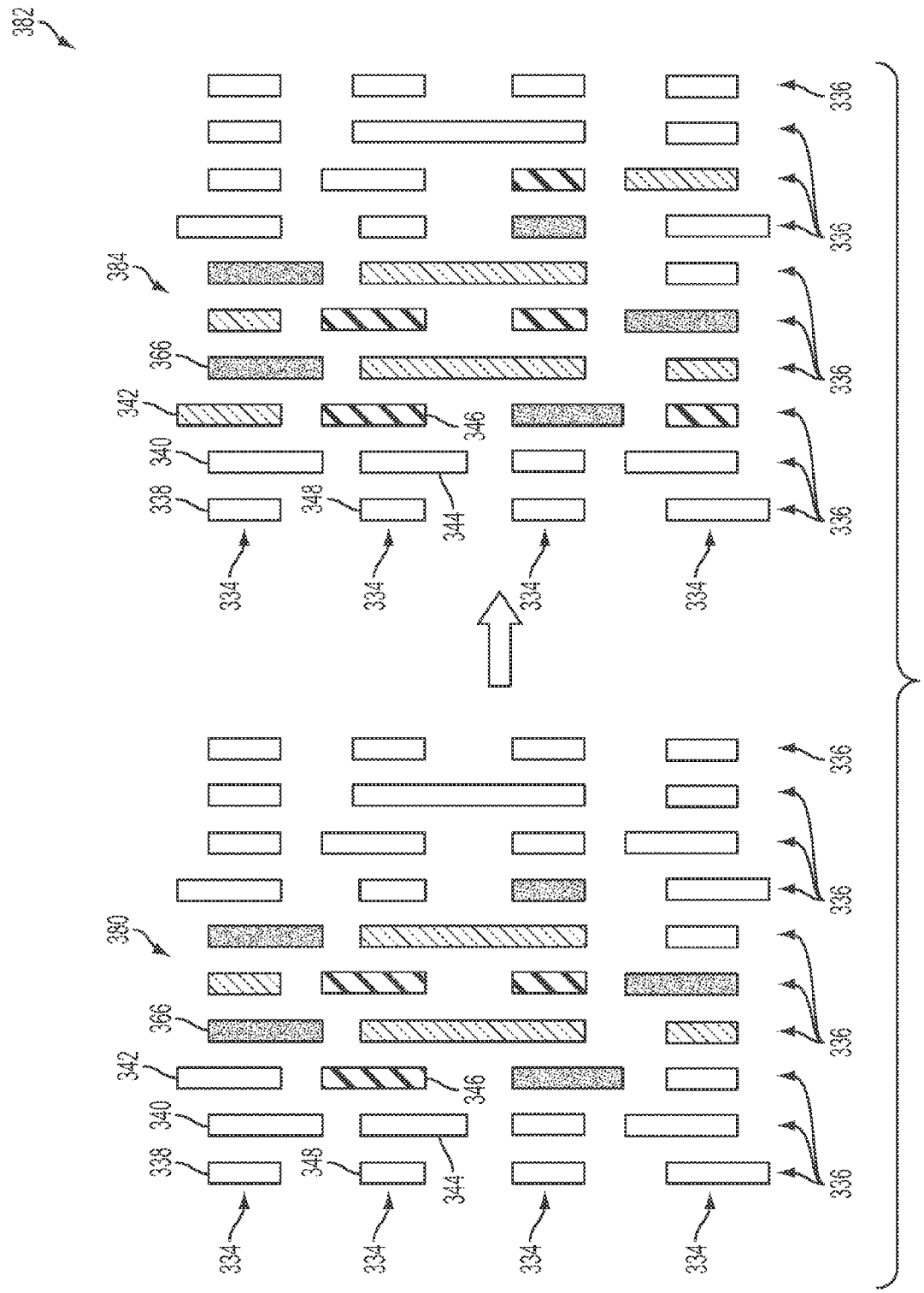
FIG. 9 is a diagram of a second colorization iteration of an accumulating 3-color pattern in a photoresist mask pattern according to an embodiment.

FIG. 9 is a diagram of a second colorization iteration 382 of an accumulating 3-color pattern in a photoresist mask pattern according to an embodiment. More polygons are replaced back into the first colorization iteration product 380 to produce the second colorization iteration product 384 from the second colorization iteration 382. For example, polygon 342 is replaced and mapped green because polygon 342 is adjacent to a red polygon 366 and a blue polygon 346.

Figure 10:
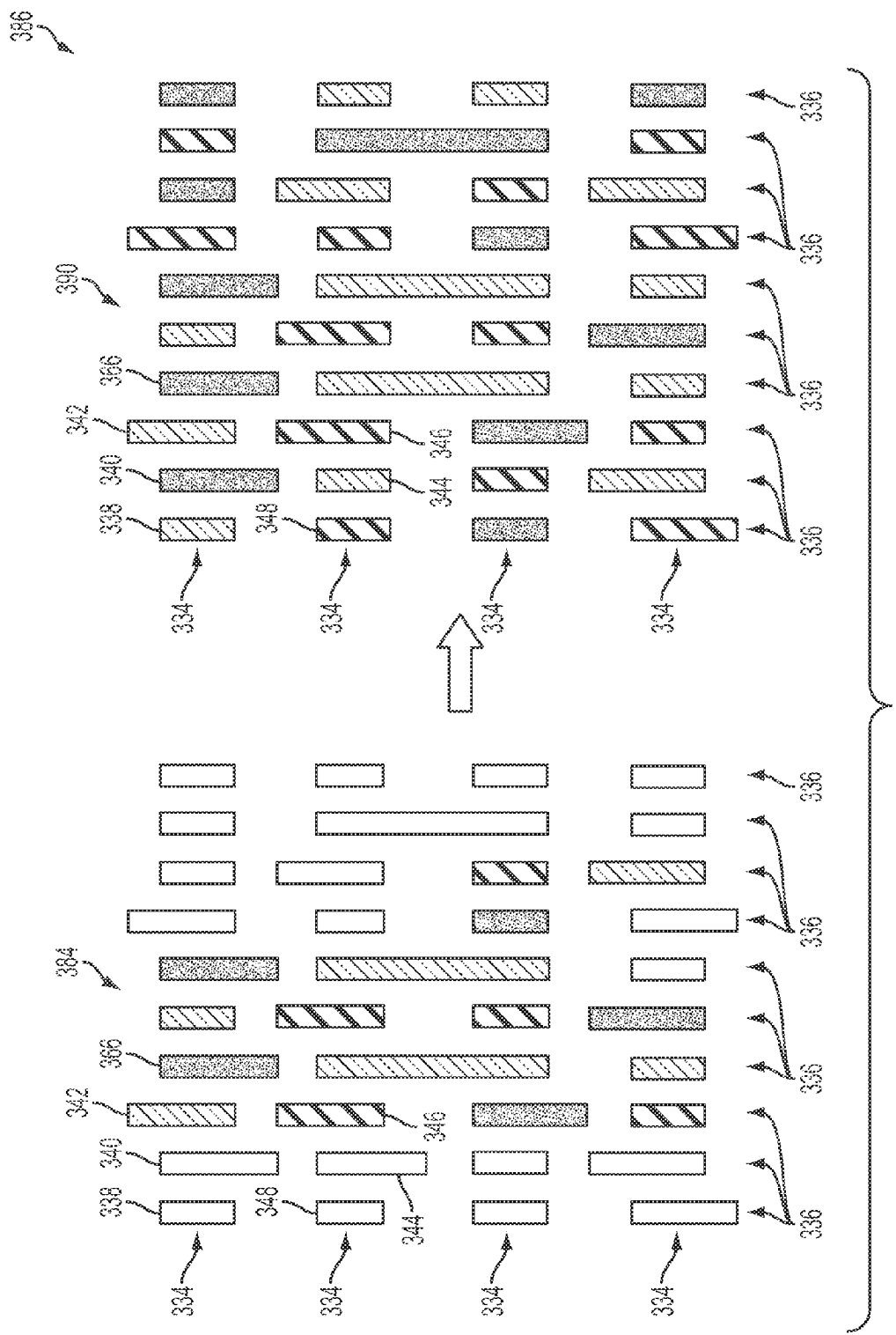
FIG. 10 is a diagram of an Nth colorization iteration of an accumulating 3-color pattern in a photoresist mask pattern according to an embodiment.

FIG. 10 is a diagram of an Nth colorization iteration 386 of an accumulating 3-color pattern in a photoresist mask pattern according to an embodiment. In this last colorization iteration, remaining temporarily removed polygons are replaced to produce a 3-color photoresist mask pattern 390 from the previous colorization iteration product. For example, polygon 338 is replaced and mapped green because polygon 338 is adjacent to red polygon 340. The completed 3-color photoresist mask pattern 390 is an indication that the single photoresist mask pattern is decomposable into three photoresist mask patterns.

Figure 11:
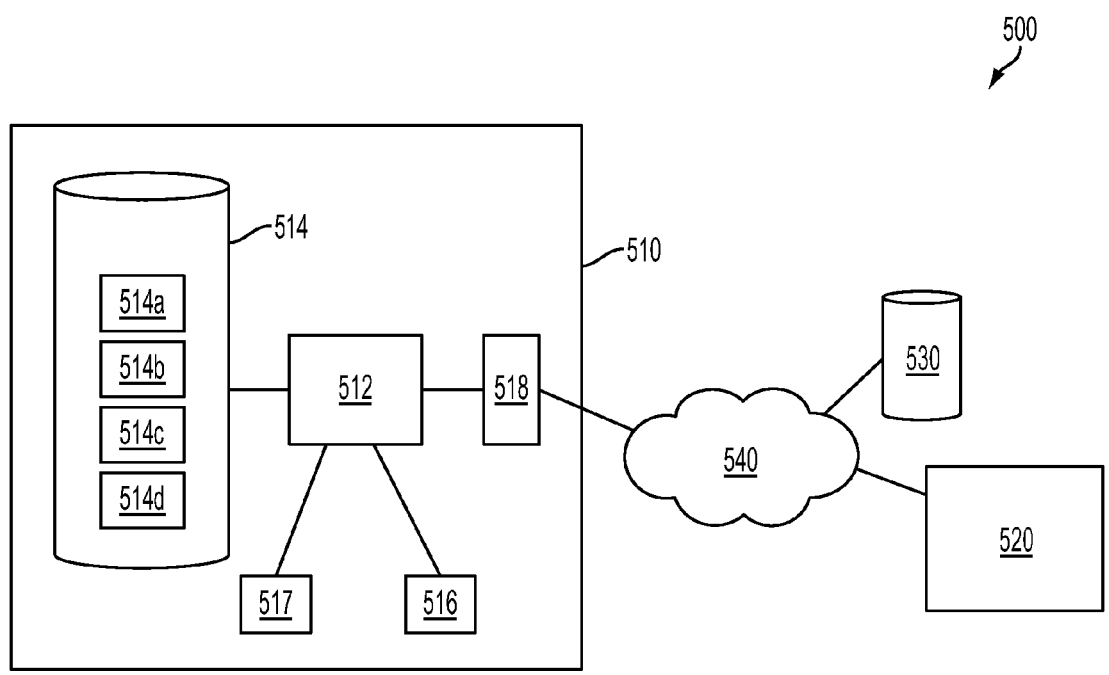
FIG. 11 is a functional block diagram of a photoresistive mask 3-colorability determining and 3-color colorization system in according to an embodiment.

FIG. 11 is a functional block diagram of a photoresist mask pattern 3-colorability determining and 3-color colorization system 500 according to an embodiment. photoresist mask pattern 3-colorability determining and 3-color colorization system 500 includes a first computer system 510, a second computer system 520, a networked storage device 530, and a network 540 connecting the first computer system 510, the second computer system 520, and the networked storage device 530. In some embodiments, one or more of the second computer system 520, the storage device 530, and the network 540 are omitted. In some embodiments, two or more of the first computer system 510, second computer system 520, and/or storage device 530 are combined into a single computer system.

The first computer system 510 includes a hardware processor 512 communicatively coupled with a non-transitory, computer readable storage medium 514 encoded with, i.e., storing, a generated integrated layout 514a, a circuit design 514b, a computer program code 514c, i.e., a set of executable instructions, and a standard cell library 514d having layout patterns as described herein. The processor 512 is electrically and communicatively coupled with the computer readable storage medium 514. The processor 512 is configured to execute the set of instructions 514c encoded in the computer readable storage medium 514 in order to cause the computer 510 to be usable as a placing and routing tool for generating a layout design based on the standard cell library 514d.

In some embodiments, standard cell library 514d is stored in a non-transitory storage medium other than storage medium 514. In some embodiments, standard cell library 514d is stored in a non-transitory storage medium in networked storage device 530 or second computer system 520. In such case, standard cell library 514d is accessible by the processor 512 through the network.

In some embodiments, the processor 512 is a central processing unit (CPU), a multi-processor, a distributed processing system, an application specific integrated circuit (ASIC), and/or a suitable processing unit.

In some embodiments, the computer readable storage medium 514 is an electronic, magnetic, optical, electromagnetic, infrared, and/or a semiconductor system (or apparatus or device). For example, the computer readable storage medium 514 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 514 includes a compact disk-read only memory (CD-ROM), a compact disk-read/write (CD-R/W), and/or a digital video disc (DVD).

The computer system 510 includes, in at least some embodiments, an input/output interface 516 and a display unit 517. The input/output interface 516 is coupled to the controller 512 and allows the circuit designer to manipulate the first computer system 510. In at least some embodiments, the display unit 517 displays the status of executing the placing and routing tool 514a in a real-time manner and provides a Graphical User Interface (GUI). In at least some embodiments, the input/output interface 516 and the display 517 allow an operator to operate the computer system 510 in an interactive manner.

Figure 12:
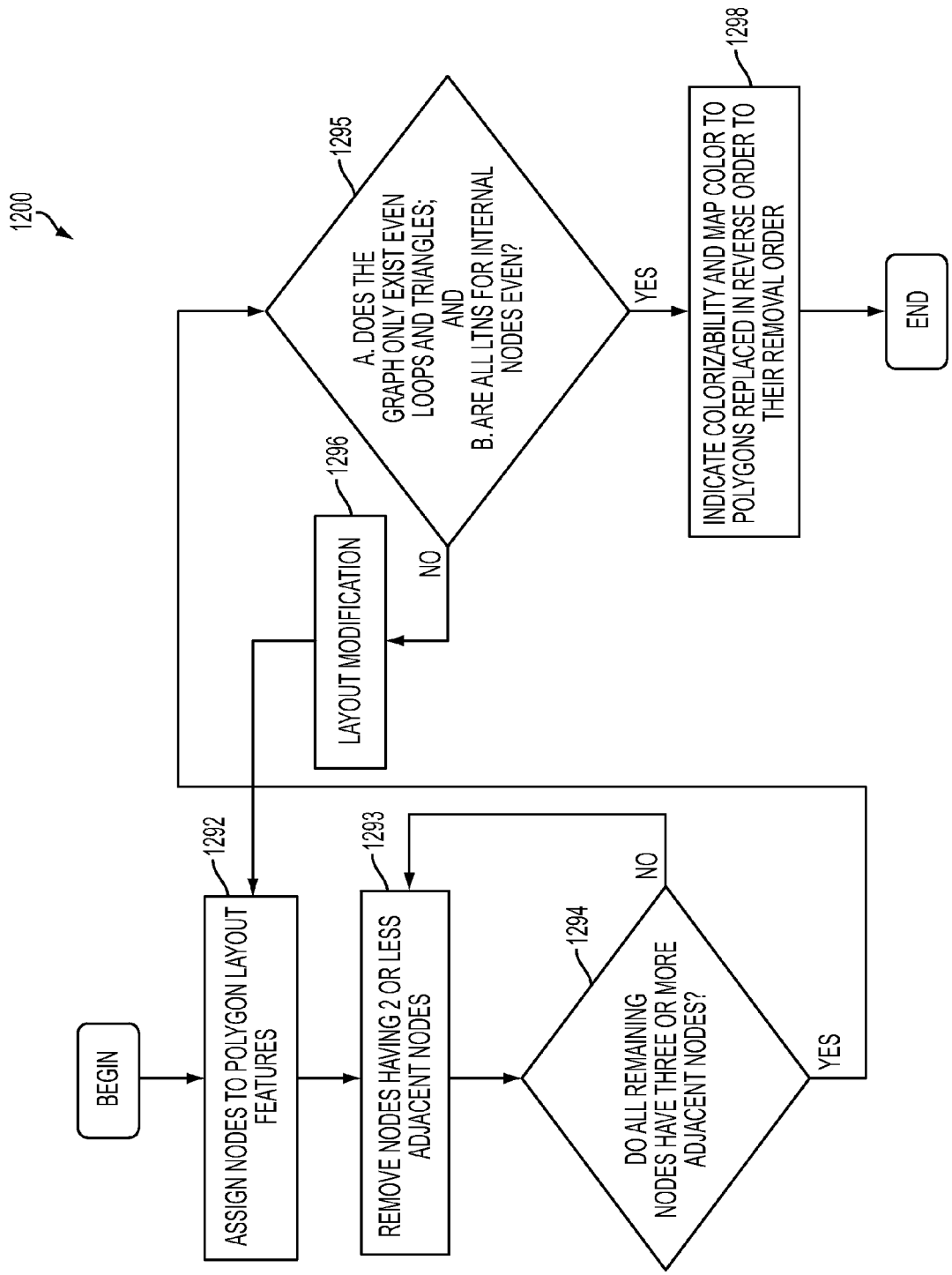
FIG. 12 is a flowchart of a 3-color colorizability determining and 3-color colorization method according to an embodiment.

FIG. 12 is a flowchart of a 3-color colorizability determining and 3-color colorization method 1200 according to an embodiment. At operation 1292, execution of the portion of computer program code 514c by processor 512 causes the processor to assign nodes to polygons in photoresist mask layout 332. The nodes are determined to be adjacent if polygon features of the mask are equal to or less than the distance G0, otherwise they are not considered to be adjacent.

At operation 1293, execution of the portion of computer program code 514c by processor 512 causes the processor to temporarily remove polygons with nodes having two or less adjacent nodes. Information about the order of temporary removal of nodes associated with polygons is stored by the processor 512 for later retrieval to facility their replacement in the colorization process. In some embodiments, information about the order of temporary removal of nodes associated with polygons is not stored by the processor 512.

At operation 1294, execution of the portion of computer program code 514c queries whether all remaining polygons have three or more adjacent nodes. If not, execution returns to operation 1293, if all remaining polygons have three or more adjacent nodes, execution proceeds to operation 1295.

At operation 1295, execution of the portion of computer program code 514c queries whether all LTNs for internal nodes even numbered and the network of nodes exists in even numbered loops and triangles. If not, execution proceeds to operation 1296 where the layout is modified to produce a layout where all LTNs for internal nodes are even numbered and the network of nodes exists in even numbered loops and triangles, and execution restarts at operation 1292. If all LTNs for internal nodes are even numbered and the network of nodes exists in even numbered loops and triangles, execution proceeds to operation 1298.

At operation 1298, an indication of 3-color colorizability is indicated and the computer program code 514c maps color to the polygons as the polygons are replaced in reverse order to their removal order using information previously stored about the polygons order of temporary removal. Any two linked nodes (and an internal node, if present) are selectable in a colorizable LTN with different colors assigned and the remaining nodes are colorable for all linked nodes, including internal nodes, as described herein (color propagation). With all nodes colored as a result of color propagation, the single photoresist mask pattern is thereby shown to be decomposable into three photoresist mask patterns. In some embodiments the processor execution of the portion of computer program code 514c replaces the polygons without using information about the polygons' order of temporary removal. The operation ends with replacement and mapping of color to polygons temporarily removed.

According to some embodiments, a method of decomposing an single photoresist mask pattern to three photoresist mask patterns includes assigning nodes to polygon features on the single photoresist mask pattern, designating nodes as being adjacent nodes for those nodes that are less than a predetermined distance apart, temporarily removing nodes having 2 or less adjacent nodes, identifying one or more internal nodes, mapping colors to the internal nodes, and replacing and mapping a color to each of the nodes removed by the temporarily removing nodes, such that each node does not have an adjacent node of the same color.

According to some embodiments, a method of decomposing an single photoresist mask pattern to three photoresist mask patterns includes assigning nodes to polygon features on the single photoresist mask pattern, designating nodes as being adjacent nodes for those nodes that are less than a predetermined distance apart, iteratively removing nodes having 2 or less adjacent nodes until no nodes having 2 or less adjacent nodes remain, identifying one or more internal nodes, mapping colors to the internal nodes, and replacing and mapping a color to each of the nodes removed by the temporarily removing nodes, such that each node does not have an adjacent node of the same color.

According to some embodiments, an integrated circuit verification system executing on a computing machine having a programmed processor includes, a processor for assigning nodes to polygon features on the single photoresist mask pattern, the processor designating nodes as being adjacent nodes for those nodes that are less than a predetermined distance apart, the processor iteratively removing nodes having 2 or less adjacent nodes until no nodes having 2 or less adjacent nodes remain, the processor identifying one or more internal nodes, the processor mapping colors to the internal nodes, the processor replacing and mapping a color to each of the nodes removed by the temporarily removing nodes, such that each node does not have an adjacent node of the same color, the processor providing an indication of decomposability of the single photoresist mask pattern to a plurality of photoresist mask patterns, and a memory storing information describing an order of iteratively removing nodes by the processor.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

One aspect of this description relates to a method of determining whether a layout is colorable. The method includes assigning, by a processor, nodes to polygon features of the layout. The method further includes designating nodes as being adjacent nodes for nodes separated by less than a minimum pitch. The method further includes iteratively removing nodes having less than three adjacent nodes from consideration to identify a node arrangement, wherein all nodes in the node arrangement have at least three adjacent nodes. The method further includes determining whether the layout is colorable based on the node arrangement. Determining whether the layout is colorable includes independently assessing each internal node of node arrangement to determine whether each internal node of the node arrangement is colorable. The method further includes generating a colored layout design for fabrication of the semiconductor device if each internal node of the node arrangement is colorable. The method further includes modifying the layout if at least one internal node of the node arrangement is not colorable.

Another aspect of this description relates to a method of determining whether a layout is colorable. The method includes assigning, by a processor, nodes to polygon features of the layout. The method further includes designating nodes as being adjacent nodes for nodes separated by less than a minimum pitch. The method further includes iteratively removing nodes having less than a predetermined number of adjacent nodes from consideration to identify a node arrangement, wherein all nodes in the node arrangement have at least the predetermined number of adjacent nodes. The method further includes determining whether the layout is colorable based on the node arrangement. Determining whether the layout is colorable includes independently assessing each internal node of node arrangement to determine whether each internal node of the node arrangement is colorable. The method further includes generating a colored layout design for fabrication of the semiconductor device if each internal node of the node arrangement is colorable. The method further includes modifying the layout if at least one internal node of the node arrangement is not colorable.

Still another aspect of this description relates to a system for determining whether a layout is colorable. The system includes one or more instructions stored on a non-transitory computer-readable medium. The system further includes a processor configured to execute the one or more instructions. The processor is configured to assign nodes to polygon features of the layout. The processor is further configured to designate nodes as being adjacent nodes for nodes separated by less than a minimum pitch. The processor is further configured to iteratively remove nodes having less than three adjacent nodes from consideration to identify a node arrangement, wherein all nodes in the node arrangement have at least three adjacent nodes. The processor is further configured to determine whether the layout is colorable based on the node arrangement. The processor is further configured to determine whether the layout is colorable by independently assessing each internal node of node arrangement to determine whether each internal node of the node arrangement is colorable. The processor is further configured to generate a colored layout design for fabrication of the semiconductor device if each internal node of the node arrangement is colorable. The processor is further configured to modify the layout if at least one internal node of the node arrangement is not colorable.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of determining whether a layout is colorable, the method comprising:
assigning, by a processor, nodes to polygon features of the layout;
designating nodes as being adjacent nodes for nodes separated by less than a minimum pitch;
iteratively removing nodes having less than three adjacent nodes from consideration to identify a node arrangement, wherein all nodes in the node arrangement have at least three adjacent nodes;
determining whether the layout is colorable based on the node arrangement, wherein determining whether the layout is colorable comprises:
independently assessing each internal node of the node arrangement to determine whether each internal node of the node arrangement is colorable;
generating a colored layout design for fabrication of the semiconductor device if each internal node of the node arrangement is colorable; and
modifying the layout if at least one internal node of the node arrangement is not colorable.

2. The method of claim 1, wherein determining whether an internal node of the node arrangement is colorable comprises determining a number of linked triangles directly connected to the internal node of the node arrangement.

3. The method of claim 2, further comprising determining the internal node of the node arrangement is colorable if the number of linked triangles is an even number.

4. The method of claim 2, further comprising determining the internal node of the node arrangement is not colorable if the number of linked triangles is an odd number.

5. The method of claim 1, wherein assigning nodes to polygon features of the layout comprises assigning a single node to each polygon feature of the polygon features of the layout.

6. The method of claim 1, wherein generating the colored layout design comprises coloring each node of the node arrangement.

7. The method of claim 6, further comprising iteratively:
re-inserting removed nodes; and
coloring the re-inserted nodes.

8. The method of claim 1, wherein modifying the layout comprises producing a layout having an even number of linked triangles connected to each internal node of the node arrangement.

9. A method of determining whether a layout is colorable, the method comprising:
assigning, by a processor, nodes to polygon features of the layout;
designating nodes as being adjacent nodes for nodes separated by less than a minimum pitch;
iteratively removing nodes having less than a predetermined number of adjacent nodes from consideration to identify a node arrangement, wherein all nodes in the node arrangement have at least the predetermined number of adjacent nodes;
determining whether the layout is colorable based on the node arrangement, wherein determining whether the layout is colorable comprises:
independently assessing each internal node of the node arrangement to determine whether each internal node of the node arrangement is colorable, wherein assessing each internal node comprises ignoring non-internal nodes of the node arrangement;
generating a colored layout design for fabrication of the semiconductor device if each internal node of the node arrangement is colorable; and
modifying the layout if at least one internal node of the node arrangement is not colorable.

10. The method of claim 9, wherein iteratively removing nodes having less than the predetermined number of adjacent nodes comprises iteratively removing nodes having less than 3 adjacent nodes.

11. The method of claim 9, wherein generating the colored layout design comprises iteratively re-inserting removed nodes into the layout in a reverse order from the iteratively removing nodes step.

12. The method of claim 9, wherein iteratively removing nodes comprises storing removed nodes in a memory device.

13. The method of claim 9, wherein determining whether an internal node of the node arrangement is colorable comprises determining a number of linked triangles directly connected to the internal node of the node arrangement.

14. The method of claim 13, further comprising determining the internal node of the node arrangement is colorable if the number of linked triangles is an even number.

15. The method of claim 13, further comprising determining the internal node of the node arrangement is not colorable if the number of linked triangles is an odd number.

16. A system for determining whether a layout is colorable, the system comprising:
one or more instructions stored on a non-transitory computer-readable medium; and
a processor configured to execute the one or more instructions, for causing the processor to perform:
assigning nodes to polygon features of the layout;
designating nodes as being adjacent nodes for nodes separated by less than a minimum pitch;
iteratively removing nodes having less than three adjacent nodes from consideration to identify a node arrangement, wherein all nodes in the node arrangement have at least three adjacent nodes;
determining whether the layout is colorable based on the node arrangement, wherein determining whether the layout is colorable comprises:
independently assessing each internal node of the node arrangement to determine whether each internal node of the node arrangement is colorable, wherein assessing each internal node comprises determining a number of linked triangles directly connected to each internal node of the node arrangement;
generating a colored layout design for fabrication of the semiconductor device if each internal node of the node arrangement is colorable; and
modifying the layout if at least one internal node of the node arrangement is not colorable.

17. The system of claim 16, wherein the processor is further configured for determining whether an internal node of the node arrangement is colorable comprises ignoring non-internal nodes of the node arrangement.

18. The system of claim 16, wherein the processor is further configured for determining the internal node of the node arrangement is colorable if the number of linked triangles is an even number.

19. The system of claim 16, wherein the processor is further configured for determining the internal node of the node arrangement is not colorable if the number of linked triangles is an odd number.

20. The system of claim 16, wherein the processor is further configured to store removed nodes on the non-transitory computer readable medium.

* * * * *